United States Patent
Marion et al.

(10) Patent No.: US 6,399,895 B1
(45) Date of Patent: Jun. 4, 2002

(54) COMPONENT HYBRIDIZING SYSTEM ALLOWING FOR DEFECTIVE PLANARITY

(75) Inventors: François Marion, Saint Egreve; Dominique Marion, Grenoble; Jean-Louis Ouvrier-Buffet, Sevrier, all of (FR)

(73) Assignee: Commissariat a L'Energie Atomique, Paris (FR)

( * ) Notice: Subject to any disclaimer, the term of this patent is extended or adjusted under 35 U.S.C. 154(b) by 0 days.

(21) Appl. No.: 09/486,990

(22) PCT Filed: Sep. 22, 1998

(86) PCT No.: PCT/FR98/02017

§ 371 (c)(1), (2), (4) Date: Mar. 6, 2000

(87) PCT Pub. No.: WO99/16120

PCT Pub. Date: Apr. 1, 1999

(30) Foreign Application Priority Data

Sep. 23, 1997 (FR) .............................. 97 11806

(51) Int. Cl.$^7$ ............................ H05K 1/16; H05K 1/11; H05K 7/10
(52) U.S. Cl. ...................... 174/260; 174/261; 174/263; 361/768; 361/770
(58) Field of Search ................................ 174/260, 261, 174/262, 263; 361/767, 768, 769, 770, 771, 772, 773, 774, 775, 776

(56) References Cited

U.S. PATENT DOCUMENTS 4,489,750 A    12/1984   Nehring
5,489,750 A     2/1996   Sakemi et al.
5,558,271 A  *  9/1996   Rostoker et al. ....... 228/180.22
5,657,207 A  *  8/1997   Schreiber et al. ........... 361/774

FOREIGN PATENT DOCUMENTS

| EP | 0405865 | * | 1/1991 |
| EP | 0602328 | * | 6/1994 |
| FR | 2688628 | * | 3/1992 |
| GB | 2313487 | * | 11/1997 |
| JP | 0514723 | * | 11/1992 |

OTHER PUBLICATIONS

PCT Search Report, (2 pages).*

* cited by examiner

Primary Examiner—Kamand Cuneo
Assistant Examiner—Quynh-Nhu H. Vu
(74) Attorney, Agent, or Firm—Burns, Doane Swecker & Mathis LLP

(57) ABSTRACT

System of components for hybridization including a first component (410) with a first set of hybridization studs (414), and at least a second component (412) with second hybridization studs (450), the first and second studs being respectively associated in pairs of studs, one of the first and one of the second studs, with at least one pair of studs, equipped with a projection (418) of meltable material and the other aforesaid first and second studs of the pair of studs, referred to as contact studs (450, 450a, 450b), having a surface wettable by the meltable material. According to the invention at least one part of the contact stud (450) forms a protuberance (452).

Application to manufacturing of electronic, electro-optic and mechanical components.

8 Claims, 5 Drawing Sheets

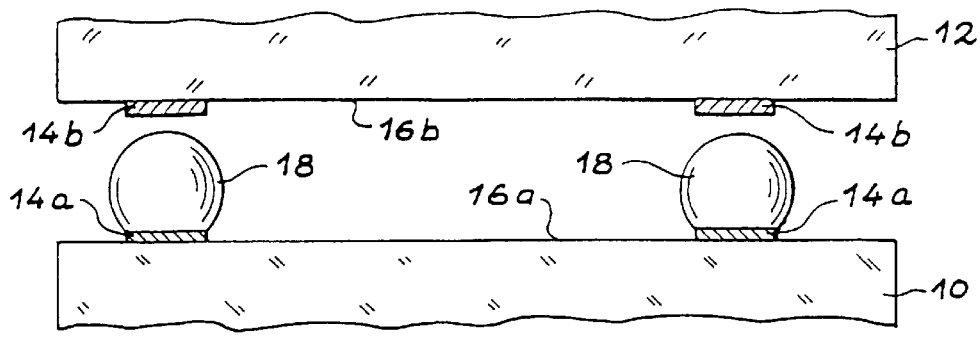
FIG._1
(PRIOR ART)
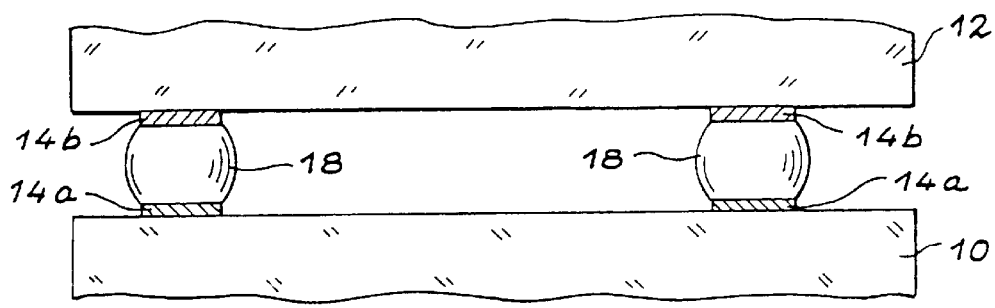
FIG._2
(PRIOR ART)
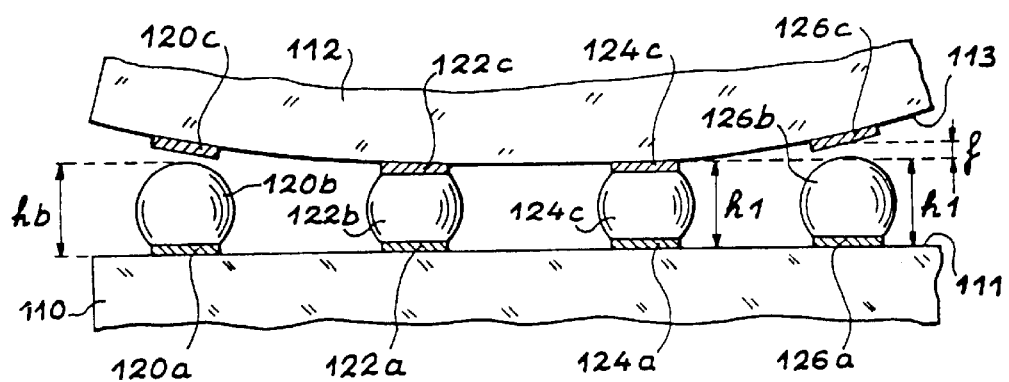
FIG._3
(PRIOR ART)

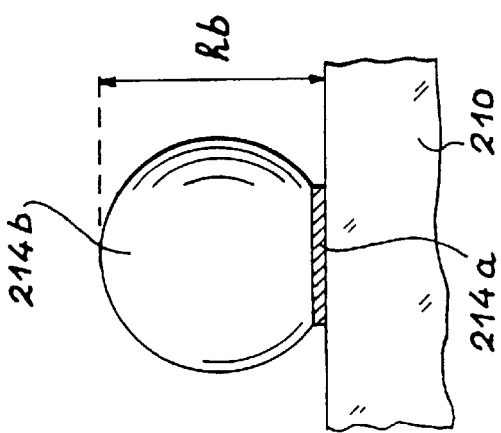
FIG._4A (PRIOR ART)
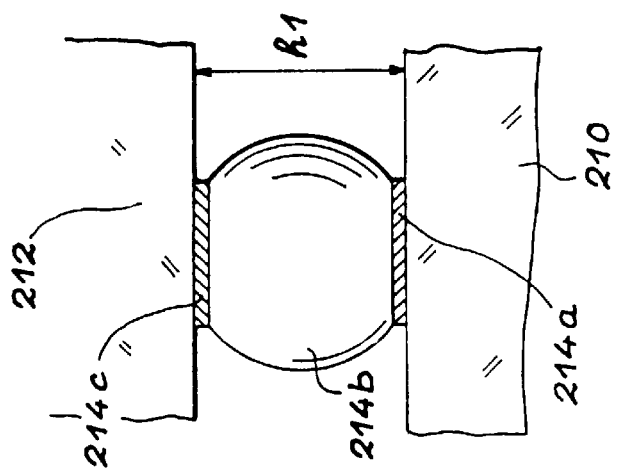
FIG._4B (PRIOR ART)
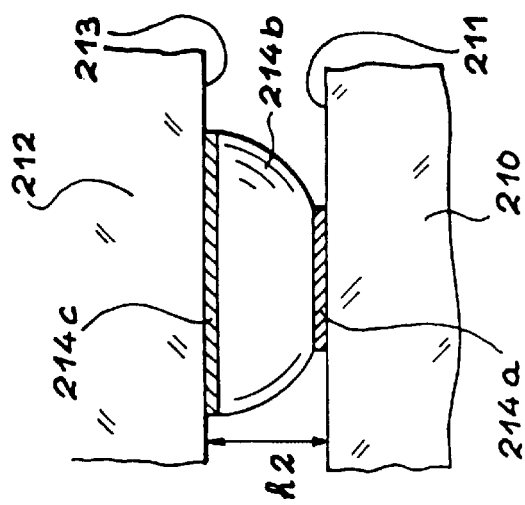
FIG._4C (PRIOR ART)

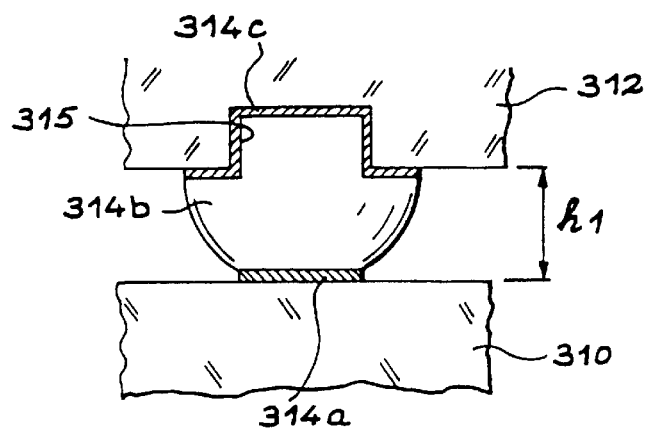
FIG._5
*(PRIOR ART)*
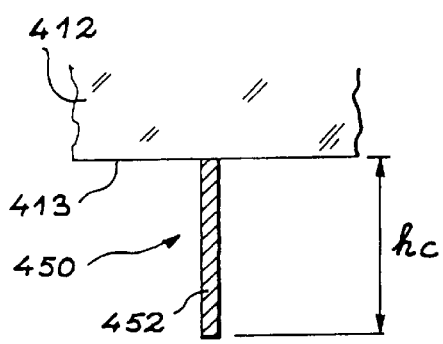
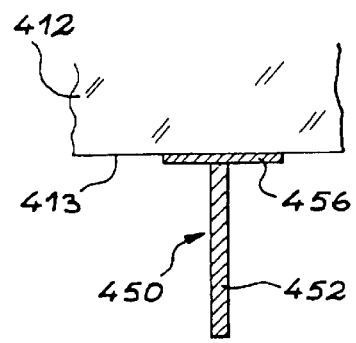
FIG._7
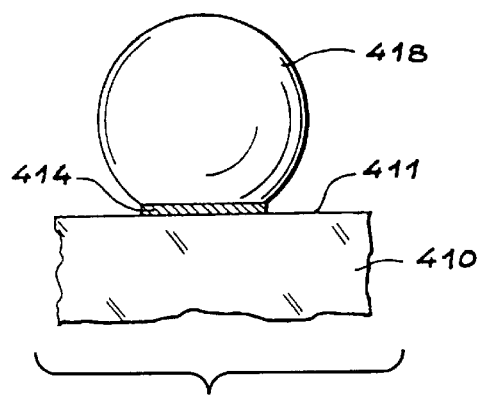
FIG._6

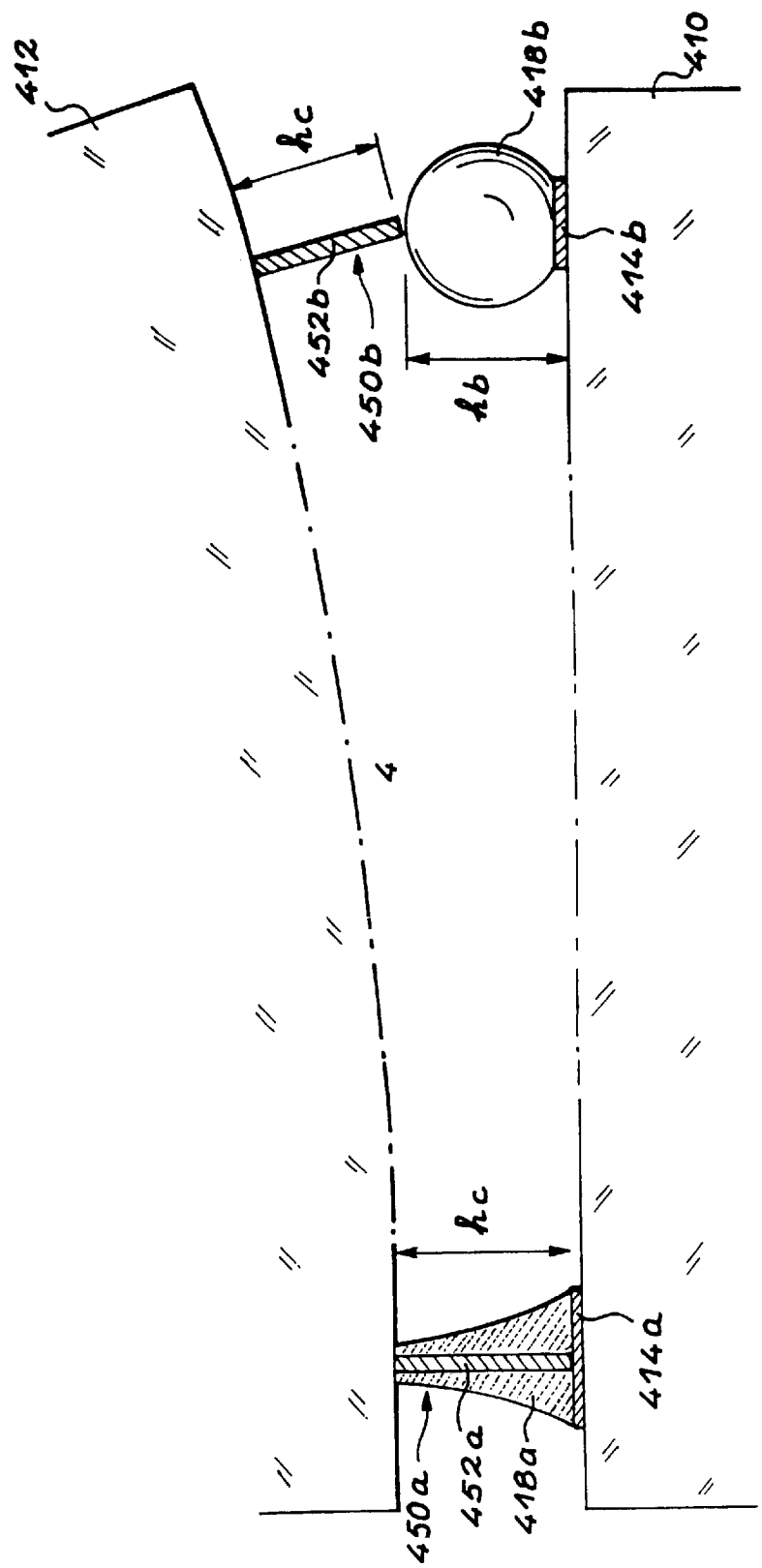
FIG._8

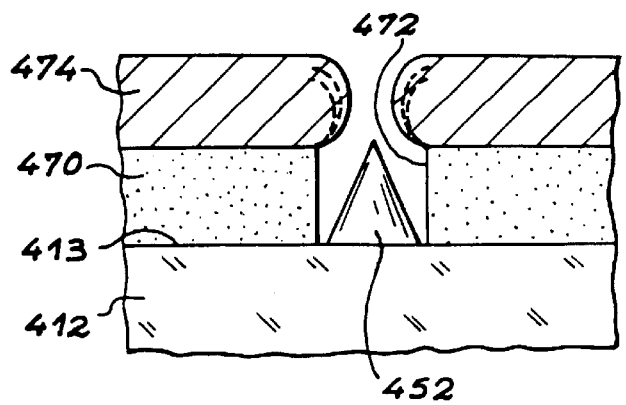
FIG._9
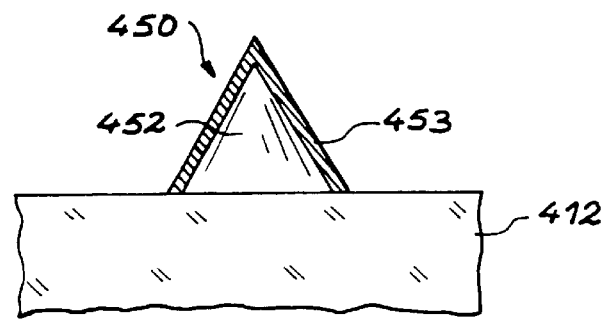
FIG. 10
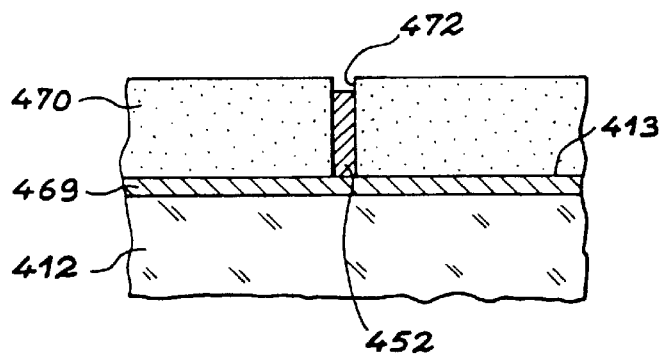
FIG._11
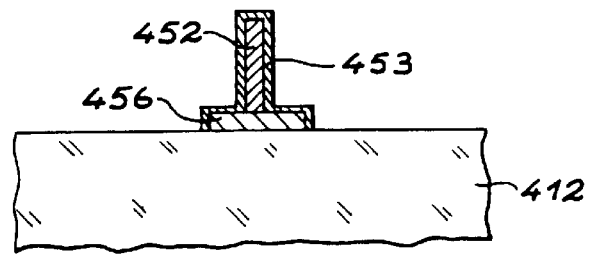
FIG._12

COMPONENT HYBRIDIZING SYSTEM ALLOWING FOR DEFECTIVE PLANARITY

FIELD OF THE INVENTION

This invention involves a system of components for hybridisation adapted to a technique for hybridisation by melting of solder projections, know as the "flip-chip" method, and which allows for uneven surfaces. The invention also involves a component substrate with hybridisation studs allowing for uneven surfaces.

In the context of the present invention, component means either an electronic component such as for example an electronic chip, an electronic circuit support, or an optoelectronic circuit support, or a mechanical component such as, for example, a cap or sensor of physical values.

The invention can be applied in the areas of electronics and optics in particular.

The invention can be used for example in the manufacturing of retinas for detection of electromagnetic waves, for hybridisation, on addressing circuits, laser matrices with vertical cavities for surface emission, or for hybridisation of optical detectors on reading circuits.

STATE OF THE PRIOR ART

There are two main techniques for hybridisation of components by solder projections.

A first technique, called "technique for hybridisation by melting" uses projections of meltable material such as an alloy of tin and lead SnPb or tin and indium SnIn for example. The technique of hybridisation by melting is illustrated by the appended drawings of FIGS. 1 and 2.

In these figures, the references 10 and 12 designate respectively a first and a second component to be interconnected. The first component 10 includes first studs 14a of a material wettable by the material of the projections of meltable material (solder). The studs 14a are surrounded respectively by an area 16a of material which is not wettable by the material of the projections. For the purpose of simplification, only two interconnection projections are shown in FIGS. 1 and 2. The components could however be equipped with a large number of projections.

In the same way, the second component 12 includes second studs 14b, also made of a material wettable by the projection material, and surrounded by an area 16b of non-wettable material.

The first and second studs 14a, 14b are associated to form pairs of studs. The studs of each pair of studs are essentially arranged face to face when the components to be hybridised 10, 12 are brought together with their hybridisation sides facing, as shown in FIG. 1.

The studs 14a of one of the components, in this case of the component 10, are equipped with projections 18 of meltable material. These projections 18 are to create a mechanical and/or electric link between the studs 14a, 14b of each pair of studs.

For a hybridisation, the component 12 is brought against the component 10 so that the studs 14b come into contact with the corresponding projections 18. The entire structure is then brought to the hybridisation temperature, greater than or equal to the melting point of the projections, in order to solder the projections 18 to the studs 14b.

All of the projections 18 are thus soldered simultaneously to the studs of the component 12 which corresponds to them. After cooling, the structure in FIG. 2 is obtained.

The accuracy of the mutual positioning of the components during the placement of the component 10 onto the component 12 is not critical. During melting of the projection material, the components 10 and 12 are automatically aligned due to the surface tension of the molten projection material.

As indicated previously, due to the process of hybridisation by melting, all of the solder joints between the projections and the receiving studs are made simultaneously. The process of hybridisation by melting is thus particularly suitable for hybridisation of several components such as chips to a receiving component which forms the substrate. A high hybridisation yield can be obtained for these structures.

FIGS. 1 and 2 illustrate the technique of hybridisation by melting in the ideal case where the first and second components are perfectly flat. In the preceding description, the uneven surfaces which often appear on components were not taken into account. This surface unevenness generally results in deflection and has a greater influence on large components.

This situation is illustrated in FIG. 3.

A first component 110 has an essentially planar hybridisation side 111 equipped with projection receiving studs 120a, 122a, 124a, 126a and projections of meltable material 120b, 122b, 124b, 126b. A second component 112 has a hybridisation side 113 equipped with studs 120c, 122c, 124c, 126c for receiving the projections.

The second component is not perfectly planar but rather has a deflection curve f indicated in the figure.

The deflection is measured between a plane which goes through the base of stud 124c, i.e. the upper part of the component curve, and a plane parallel to the plane which goes through the base of stud 124c and passing through the furthest reception stud from the plan which is, in the case of the example of the figure, stud 126c.

In FIG. 3, hb indicates the height of the projections which have not yet been soldered onto the receiving studs of the component 112. The height hb is measured from the hybridisation surface 111. $h_1$ indicates the distance separating the first plane of the surface 111 after hybridisation of the components 110 and 112. The distance h1 is referred to in the remainder of the description as the "hybridisation height."

The absence of a connection between the studs 120c, 126c and their corresponding projections 120b, 126b is seen in FIG. 3. This flaw is due to the excessive mechanical deflection of the component 112.

Once the projections 122b, 124b are soldered to the receiving studs 122c and 124c, the hybridisation height $h_1$ at the lowest point of the component 112, i.e. the point closest to the hybridisation surface 111 of the component 110, is defined.

One receiving stud of the component 112 does not come into contact with its corresponding solder projection if the distance F which separates it from the plane which goes through the base stud is such that $h_1+f>hb$, i.e. $f>hb-h_1$.

This is the case for studs 120c and 126c.

The height of the solder projections can be easily calculated from the volume of meltable material from the projections and the wettable surface of the receiving studs 120a, 122a, 124a and 126a (sphere truncated by a disk). In the same way, the height h1 can be calculated by taking into account the volume of meltable material of the projections and the wettable surfaces of the receiving studs of each component (sphere truncated by two disks).

Considering that the volume of meltable material is essentially the same for all of the projections, it is possible to determine the maximum allowable deflection f before connection flaws of the projections appear.

Thus in effect $F=hb-h_1$.

It is immediately apparent that this problem gets worse when the dimensions of the projections, and thus their height hb, is smaller. The problem is also aggravated for hybridisation of large components for which the deflection is naturally larger.

As an example, for hybridisation of a component with a matrix distribution of projections with a pitch of 25 μm, the projections can have a thickness of 10 μm between the receiving studs of each component (after hybridisation and a diameter of 15 μm.

When, before hybridisation, these projections equip the receiving studs of a first component which has a diameter of 12 μm, the height hb of the projections (in the form of spheres) not connected is hb=12.6 μm. The hybridisation height $h_1$ is, for the same data, such that: $h_1$=10.4 μm.

The maximum acceptable deflection f is thus 12.6−10.4= 2.2 μm. Components with a deflection less than such a maximum deflection are generally small. If the components are larger however, for example components with 2 cm sides, a deflection tolerance of 2.2 μm is unacceptable. The price of flattening the components to respect such tolerances becomes prohibitive.

It is known that the maximum acceptable deflection can be increased by increasing the size of the hybridisation studs of one of the components to be hybridised.

More precisely, in a set of components to be hybridised, there is a first component for which the hybridisation studs equipped with projections of meltable material are a first area, and a second component with corresponding hybridisation studs which have a second area greater than the first one.

As the area of the wettable surface of the second studs is greater than that of the first studs, the hybridisation height as defined previously is reduced.

In addition, for a given volume of meltable material, the height of the projections before soldering remains high because these projections are formed on the first studs with a smaller area. The combination of these two effects allows for a greater deflection or greater unevenness of the components.

The advantage of increasing the size of the hybridisation studs of one of the components is illustrated by the appended FIGS. 4A, 4B and 4C.

FIG. 4A represents a partial section of a component 210, equipped with a first reception stud 214a with a surface area $S_1$ and equipped with a projection 214b. The projection has a predetermined volume V and its height before hybridisation is noted hb.

FIG. 4B shows a partial section of a system of components 210 and 212 respectively equipped with receiving studs 214a and 214c, in disk form, and linked by a projection of meltable material 214b. FIG. 4B can be considered as illustrating the structure obtained by hybridising the component of FIG. 4A, equipped with the projection, with the second component 212.

The projection 214b which also has a volume V is soldered respectively to studs 214a and 214c which have a surface having essentially the same area $S_1$. This corresponds to a typical situation. The hybridisation height measured on the hybridisation sides facing components 210 and 212 is indicated by $h_1$ on FIG. 4B.

In the manner explained previously, the maximum admissible deflection in this case is $f_1=hb=h_1$.

FIG. 4C shows a partial section of a system of components 210, 212 of which the receiving studs have a wettable surface with a different area.

As in the preceding figures, the component 210 is linked to component 212 by a projection 214b of meltable material. The projection of meltable material is, as in FIGS. 4A and 4B, soldered to a receiving stud 214a, formed on the hybridisation surface 211 of component 210 and having area $S_1$. The projection has a volume of meltable material equal to V.

However, component 212 has on its hybridisation side 213 a stud for receiving a projection, reference 214c, which has a surface with an area $S_2$ greater than area $S_1$.

FIG. 4C thus illustrates the structure obtained by hybridising the component in FIG. 4A, equipped with a projection of meltable material, with component 212, equipped with a projection receiving stud with a wettable surface of which area $S_2$ is greater than area $S_1$.

By comparing FIGS. 4B and 4C, it is seen that the hybridisation height $h_2$ of the structure of FIG. 4C is less than the hybridisation height $h_1$ of the structure in FIG. 4B.

For a given volume of meltable projection material, i.e. for a given height of projection hb before soldering, since the hybridisation height is lower ($h_2<h_1$), the maximum allowable deflection ($f_2=hb-h_2$) is thus greater ($f_2>f_1$)

An illustration can be found in document (1) for which the reference is given at the end of the description.

The approach presented above suffers from a certain number of limitations linked to the increase in the number of hybridisation studs per unit of area for highly integrated components.

Designating as d the dimension in a given direction of the hybridisation studs for which the area is the greatest (d is for example the diameter) and as Δ the minimum spacing needed between the projections of meltable material for manufacturing reasons, the pitch p between the projections, in a given direction, must be such that $$p \geq d+\Delta$$

Estimating that Δ is greater than or equal to 3 μm, it is impossible to compensate for a deflection of 4 μm or more when the pitch between the projects (or the studs) is less than 15 μm.

The appended FIG. 5 shows another possibility for making hybridisation studs.

A first component 310 is equipped with an "ordinary" hybridisation stud 314a, in the form of a disk, on which a projection 314b of meltable material is formed. The stud 314a has a surface with area $S_1$.

The first component 310 is associated with a second component 312 equipped with a second hybridisation stud 315 with a surface of area $S_2$ which is greater than $S_1$. It is seen that the second hybridisation stud 315 has a recessed part in the form of a well 315a which allows for an increase in the size of the stud while reducing its crowding.

With a structure in accordance with FIG. 5, the pitch between the hybridisation studs can be reduced. The presence of a well 315a however reduces the hybridisation height $h_1$ as defined previously (and indicated on FIG. 5). The available spacing between the components thus becomes very tight and good cleaning of the solder flux, which is necessary for remelting hybridisation techniques, becomes impossible. The little free space between the projections and the components prevents good cleaning of the flows.

At least a partial solution to the problems mentioned above can be found by using a second hybridisation technique referred to as the "pressure hybridisation technique."

This technique starts with a structure comparable to that shown in FIG. 1. The component 12 is brought onto the component 10 by precisely aligning the studs 14b with the projections 18. Then, by applying appropriate forces to the components 10 and 12, the projections 18 are pressed firmly against the studs 14b to make a thermocompression bond.

This operation takes place at a temperature below the melting point of the projection material.

During pressure hybridisation, unevenness of component surfaces may be compensated for by controlling the hybridisation height. The hybridisation height is controlled in particular by crushing the projections to a greater or lesser extent. For a component with an uneven surface, the neighbouring projections at the summit of the curve caused by the unevenness are crushed until the most distant projections adhere to their corresponding receiving studs.

The pressure hybridisation technique has some drawbacks with respect to the melting hybridisation technique however.

For example, for pressure hybridisation the alignment of the components to be hybridised must be done with great accuracy. The auto-alignment phenomenon which exists for melting hybridisation does not occur at temperatures below the melting point of the projection material.

In addition, and unlike melting hybridisation, pressure hybridisation is unsuitable for simultaneous connection of many components during a given operation. The manufacturing yields are thus lower.

SUMMARY OF THE INVENTION

This invention proposes a system of components for hybridisation which avoids the problems mentioned above.

In particular, the invention proposes components for hybridisation allowing for hybridisation despite substantial unevenness compared with known structures.

Another purpose is to propose such components on which the pitch between the hybridisation studs can be reduced.

Still another purpose is to propose such components for which the hybridisation height remains sufficient to allow for good cleaning of solder flux.

In order to achieve these aims, the invention more precisely involves a system of components for hybridisation including a first component with a hybridisation side with first hybridisation studs, and at least a second component with a hybridisation side with second hybridisation studs, the first and second hybridisation studs being respectively associated in pairs of studs and arranged in places such that, on the first and second components, each second stud of a pair of studs is located essentially facing the first stud of the pair of studs when the first and second components are assembled with the hybridisation sides facing, one of the first and second studs, of at least one pair of studs, being equipped with a projection (also referred to herein as a convex bump) of meltable material and the other of the aforesaid first and second studs of the pair of studs, called the contact stud, having a surface made entirely of a material wettable by the meltable material. In accordance with the invention, at least one part of the contact stud forms a protuberance. In addition, the projections preferably have a quantity of meltable material sufficient to cover the protuberance during hybridisation.

The invention applies to all types of components, but in particular to components with a deflection or other surface unevenness.

The protuberance formed by the contact hybridisation stud allows for a substantial increase in the area of the wettable surface of the stud.

With the invention, the minimum hybridisation height is equal to the height of the protuberance formed by the contact stud(s) of the structures to be hybridised. By adjusting this height to a desired value, a sufficient spacing can always be had between the hybridised components to allow for good cleaning of the flux.

The maximum deflection which can be compensated for without producing a hybridisation flaw corresponds to the height hb of the projection of meltable material before hybridisation. It is sufficient that the extremity of the protuberance of the contact hybridisation stud, which faces the stud with the meltable material, reach the top of the projection of meltable material for an electrical and mechanical contact to be made.

Due to the invention it is no longer necessary to increase the diameter of the hybridisation studs to increase the area of their wettable surface. A greater density of hybridisation studs is thus possible.

The hybridisation studs with a wettable protruding surface can be in the form of a column which is essentially perpendicular to the hybridisation side of the component which bears these studs.

More generally, the protuberance of the stud can be a protrusion or elevation on the surface of the component of which the height, measured with respect to the hybridisation side, is greater than a maximum cross section. Maximum cross section means a maximum section measured essentially perpendicular to the protuberance. This is the case for a column of which the height is greater than the diameter which constitutes the cross section (maximum).

Based on one particular embodiment of a stud with a wettable surface which protrudes. This stud may have a base part in the form of a disk and a protruding part mounted on the base part.

According to a particular aspect of the invention, the height of the protuberance may be lower than the height of the projection of meltable material formed on the corresponding stud of the pair of studs.

The invention also involves a component substrate including at least one hybridisation stud of which at least one part protrudes.

Other characteristics and advantages of the invention will be clearer from the following description with reference to appended figures of drawings. This description is purely illustrative and in no way limiting.

BRIEF DESCRIPTION OF THE FIGURES

FIG. 1, already described, is a schematic section of a system of components to be hybridised illustrating known hybridisation techniques, FIG. 2, already described, is a schematic section of the system of components in FIG. 1 after hybridisation, FIG. 3, already described, is a schematic section of a system of components to be hybridised in which one of the components has an uneven surface, FIGS. 4A, 4B and 4C, already described, show respectively a first hybridisation stud with a projection of solder before hybridisation, the stud with the solder projection after hybridisation, on a stud of the same diameter, and the stud with the solder projection after hybridisation on a stud of a larger diameter, FIG. 5, already described, is a partial section view of a component to be hybridised showing a particular embodiment of a known hybridisation stud, FIG. 6 is a partial section view of a system of components to be hybridised including a hybridisation stud forming a protuberance according to the invention, FIG. 7 is a section view illustrating a variant for embodiment of a hybridisation stud forming a protuberance, FIG. 8 is a schematic partial section of a system of components according to the invention, illustrating the compensation for the unevenness of one of the components.

FIGS. 9 and 10 represent in section the steps of a process for manufacturing hybridisation studs with protuberances, FIGS. 11 and 12 represent in section the steps of a variation of the process for manufacturing hybridisation studs with protuberances.

DETAILED DESCRIPTION OF EMBODIMENTS OF THE INVENTION

FIG. 6 shows a system of components including a first component 410 with a substrate with a hybridisation side 411 and a second component 412 with a substrate with a hybridisation side 413.

The first component has a first hybridisation stud 414 equipped with a projection of meltable material 418. This projection of material is essentially in the form of a sphere with no concave part nor depression. Therefore, the projection of meltable material 418, is commonly referred to in the art as a bump, or more appropriately, as a convex bump.

The first stud is in the form of a disk with surface made of material wettable by the meltable projection material.

More precisely, the disk can be made of a massive material wettable by the meltable material or can be a stack of layers of which the surface layer is made of a material wettable by the meltable material.

For example, the projection of meltable material 418 is made of a tin-lead (SnPb) alloy and the hybridisation stud 414 is made of copper.

The second component 412 has a second hybridisation stud 450, forming with the stud 414 of the first component a pair of hybridisation studs. These hybridisation studs are essentially located face to face when the first and second components are assembled with their hybridisation sides facing.

FIG. 6 and this description present only one pair of studs in the interest of simplification. Such a system of components could however include several such pairs of juxtaposed studs.

According to the invention, the hybridisation stud 450 of the second component, which initially does not have meltable material, forms a protuberance 452. In the example of FIG. 6, the hybridisation stud 450 is in the form of a column. Its height measured from the hybridisation side is indicated by hc.

When the meltable material of the projection 418 is brought to a temperature greater than or equal to its melting point, the second component 412 is brought toward the first component 410 and the protuberance 452 plunges, at least in part, into the meltable material.

The material of the second hybridisation stud 450, or at least the material which appears on the surface of the protuberance is, as for the first stud 414, wettable by the meltable material of the projection 418.

During cooling of the structure all or part of the protuberance is soldered in the projection of meltable material. If the components have several pairs of hybridisation studs as described above, the soldering of all of these studs can take place during one and the same operation. The projections of meltable material will have a quantity of material sufficient to completely cover the wettable protuberance. The covering of the protuberance is done hot, by capillarity, while the meltable material is molten.

FIG. 7 shows in section another possible embodiment of a hybridisation stud 450 of the second component 412. According to this embodiment, the stud 450 includes a base part 456 in the form of a disk formed flat on the hybridisation side and a protruding part 452 on the base part 456 which forms a protuberance in the sense of the present invention. As for the protuberance, the surface of the base part 456 is wettable by the meltable material.

FIG. 8 shows two pairs of hybridisation studs located respectively a opposite ends of components, one of which has a substantial deflection. The pairs of studs shown are those for which the difference in hybridisation height is maximal. To distinguish the parts of the two pairs of hybridisation studs, the references for them are respectively followed by the letters a and b.

The elements in FIG. 8, similar or identical to those in FIG. 6 already described, are indicated with references having the same numerical part. The preceding description can thus be referred to for these elements.

The first pair of hybridisation studs 414a, 450a is located at one extremity of the system of components where the distance which separates the hybridisation sides is lowest.

The second component 412 (with substantial deflection) is brought towards the first component 410 so that the protuberance 452a of the hybridisation stud 450a touches or is very close to the first hybridisation stud 414a. Ignoring the low thickness of the first hybridisation stud 414a, the minimum hybridisation height (hmin) is essentially equal to the height of the protuberance 452a (hc) thus $$h\text{min} \approx hc$$

It is seen that the meltable material 418a initially present on the first hybridisation stud 414a coats the protuberance 452a of the second stud by capillarity.

The second pair of hybridisation studs 414b, 450b is located at the other extremity of the system of components where the distance between the hybridisation sides is greatest.

The distance between the hybridisation sides is intentionally shown very slightly greater than the maximum distance which can be compensated for by the invention.

The first stud 414b is equipped with a projection of meltable material 418b for which the height is indicated as hb.

The protuberance 452b of the second stud 450b has height hc and goes up to the projection of meltable material 418b, without quite reaching it.

Once the protuberance reaches the meltable material (melted) of the projection, an electrical and mechanical contact can be established and the soldering occurs by capillarity acting on the molten material.

The maximum hybridisation height is thus $$h\text{max} = hb + hc$$

i.e. the sum of the height of the projection of meltable material and the height of the protuberance of the second hybridisation stud.

The components can have a maximum deflection f with f=hmax−hmin without risk for the hybridisation. Thus f=hb, i.e. the maximum allowable deflection corresponds to the height of the projections of meltable material.

By comparing the maximum allowable deflection in the case of the invention (f=hb) to the maximum allowable deflection in the case of known components of the prior art described in the first part of the description (f=hb–h$_2$), it is immediately apparent that much greater unevenness is allowable.

By way of comparison, for a device according to FIG. 4C for which the diameter of the second hybridisation stud is 10 μm and the height of the projections of meltable material is 8.5 μm, the hybridisation height is 6 μm and a maximum deflection on the order of 2.5 μm can be compensated.

In the case of the invention, for identical projections of meltable material (hb=8.5 μm) and for second studs for which the height of the protuberance is for example 8 μm, a maximum allowable deflection of 8.5 μm is obtained (i.e. increase of 6 μm) as well as a hybridisation height of 8 μm (increase of 2 μm).

As indicated previously, the cleaning of the flux after hybridisation is also easier.

For the purpose of simplification, the above description concerns components for which all of the projections have the same height and for which the protuberances of the hybridisation studs also have the same height. Projections of different diameters and studs with protuberances of different heights could also be used with the components. This is the case for example when the studs of a component are not all made in the same plane of the hybridisation side (studs made in recessed areas on the hybridisation side).

FIGS. 9 and 10 illustrate, as an example, a process for manufacturing hybridisation studs including a protuberance. In these figures, parts which are identical, similar or equivalent to the parts in FIGS. 6 to 8 have the same references.

On the hybridisation side 413 of a component 412, a resin mask 470 is formed with one or several openings 472 at places where the hybridisation studs are to be formed. Plating of metal, nickel for example, by evaporation or spraying, leads to formation of a metal layer 474 on the mask 470 which gradually fills the openings 472.

Metallic cones 452 constituting the protuberances are thus formed in the openings 470 of the hybridisation side 413. For reasons of simplification, the figures show only a single protuberance 452. As FIG. 10 indicates, a peeling operation allows for elimination of the resin mask and the metal layer 474 covering it.

The depositing of a layer of gold 453 on the metallic cones would make them wettable, if necessary, and complete the manufacturing of the hybridisation studs 450.

FIGS. 11 and 12 illustrate an embodiment variant for the hybridisation studs. In these figures, parts which are identical, similar or equivalent to the corresponding parts in FIGS. 6 to 10 have the same references.

As FIG. 11 shows, a conducting metal layer 469 is first formed on the hybridisation side 413 of component 412, followed then by a thick resin layer 470.

The thick resin layer has one or several openings 472 at the places where the hybridisation studs are to be formed. Then a metal such as nickel for example is formed by electrolysis in the openings 472, using the conducting layer 469 as an electrode.

The resin layer 470 is then eliminated and the conducting layer 469 is etched to form the base parts 456 of the hybridisation studs. Then the base parts 456 and the metal formed by electrolysis, which constitute the protuberances, can be covered with a layer 453 of material wettable by the meltable material, such as a layer of gold for example. These operations are illustrated by FIG. 12 which shows the making of a single hybridisation stud 450 with a protuberance.

DOCUMENT CITED (1) U.S. Pat. No. 5,289,750.

What is claimed is:

1. System of components for hybridisation including a first component (410) with a hybridisation side (411) with first hybridisation studs (414, 414a, 414b), and at least a second component (412) with a hybridisation side (413) with second hybridisation studs (450, 450a, 450b), the first and second hybridisation studs being respectively associated in pairs of studs and arranged in places such that, on the first and second components, each second stud of a pair of studs is located essentially facing the first stud of the pair of studs when the first and second components are assembled with the hybridisation sides facing, one of the first and second studs of at least one pair of studs being equipped with a convex bump (418, 418a, 418b) of meltable material and the other of the aforesaid first and second studs of the pair of studs, called the contact stud (450, 450a, 450b), having a surface made entirely of a material wettable by the meltable material, characterized in that at least one part of the contact stud (450, 450a, 450b) forms a protuberance (452, 452a, 452b) and in that the contact stud has no meltable material before hybridisation.

2. System according to claim 1, in which the convex bump has a quantity of meltable material sufficient to completely cover the protuberance during hybridisation.

3. System according to claim 1, in which the protuberance (452, 452a, 452b) has a height greater than a cross section of the aforesaid protuberance.

4. System according to claim 3, in which the protuberance forms a column which is essentially perpendicular to the hybridisation side.

5. System according to claim 1, in which the contact stud has a base part (456) in the form of a disk and a protruding part (452) on the base part forming the protuberance.

6. System according to claim 1, in which the protuberance has a height greater than the height of a projection of meltable material.

7. System according to claim 1, in which the hybridisation stud is in the form of a column.

8. System according to claim 1, in which the contact stud has a first base part (456) in the form of a flat disk formed on the hybridisation side and a second part (452) forming a column which protrudes from the base part.

* * * * *